United States Patent
Zha

(10) Patent No.: US 7,764,503 B2
(45) Date of Patent: Jul. 27, 2010

(54) HEAT DISSIPATION DEVICE

(75) Inventor: Xin-Xiang Zha, Shenzhen (CN)

(73) Assignees: Fu Zhun Precision Industry (ShenZhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/255,656

(22) Filed: Oct. 21, 2008

(65) Prior Publication Data

US 2009/0290309 A1 Nov. 26, 2009

(30) Foreign Application Priority Data

May 23, 2008 (CN) .................. 2008 1 0067413

(51) Int. Cl.
*H05K 7/20* (2006.01)

(52) U.S. Cl. ............. 361/704; 361/679.47; 361/679.54; 361/700; 361/710; 361/695; 165/80.3; 165/121; 165/185; 174/16.3; 257/718; 257/719

(58) Field of Classification Search ............ 361/679.46, 361/679.52, 679.54, 679.57, 688, 689, 690–712, 361/715–724; 165/80.2, 80.3, 80.4, 80.5, 165/104.33, 104.34, 185; 257/706–727; 174/15.1, 16.3, 252; 411/371.2, 426; 29/830, 29/832

See application file for complete search history.

(56) References Cited

U.S. PATENT DOCUMENTS

| | | | |
|---|---|---|---|
| 6,786,691 B2 * | 9/2004 | Alden, III ................ 411/371.2 |
| 7,142,422 B2 | 11/2006 | Lee et al. | |
| 7,239,518 B2 * | 7/2007 | Yang et al. ................ 361/704 |
| 7,298,620 B2 * | 11/2007 | Wu ........................... 361/700 |
| 7,589,967 B2 * | 9/2009 | Zhou et al. ................ 361/697 |
| 7,609,522 B2 * | 10/2009 | Jin et al. ................... 361/710 |
| 2003/0159819 A1 * | 8/2003 | Lee ............................ 165/185 |
| 2006/0120053 A1 * | 6/2006 | Lee et al. ................... 361/704 |
| 2006/0171795 A1 * | 8/2006 | Cromwell et al. .......... 411/426 |
| 2006/0232944 A1 | 10/2006 | Zhang et al. | |
| 2007/0058343 A1 * | 3/2007 | Deng et al. ................ 361/695 |
| 2007/0133175 A1 * | 6/2007 | Wu ........................... 361/704 |
| 2007/0253160 A1 * | 11/2007 | Lu et al. .................... 361/695 |
| 2008/0083528 A1 * | 4/2008 | Chen et al. ................ 165/121 |
| 2008/0130228 A1 * | 6/2008 | Zhou et al. ................ 361/697 |

* cited by examiner

*Primary Examiner*—Michael V Datskovskiy
(74) *Attorney, Agent, or Firm*—Frank R. Niranjan

(57) ABSTRACT

A securing device includes a securing member defining a securing hole, and a fastener. The fastener includes a spring, and a bolt having a main portion, a bottom fixing portion, and a top head portion. The securing hole includes an inner portion and an outer portion extending horizontally from the inner portion to an outside. A width of the outer portion is smaller than the fixing portion and larger than the main portion. The main portion enters into the inner portion through the outer portion. The fixing portion abuts against a bottom of the securing member. The spring is compressed between a top of the securing member and the head portion. A concave is depressed from the securing member and surrounds the inner portion. A lower portion of the spring is fittingly received in the concave.

18 Claims, 8 Drawing Sheets

HEAT DISSIPATION DEVICE

BACKGROUND

1. Field of the Disclosure

The disclosure generally relates to a heat dissipation device, and particularly to a securing structure of the heat dissipation device.

2. Description of Related Art

With the continuing development of the electronic technology, electronic packages, such as CPUs, are generating more and more heat which requires immediate dissipation. A thermal module is usually mounted on the electronic component for dissipating heat generated thereby, and a plurality of mounting elements are needed for securing the thermal module onto the electronic component. Generally each mounting element includes a bolt defining an annular groove near a bottom thereof, a spring disposed around a top of the bolt, and a ring-like clipping member. After the bolts extend through the thermal module, the clipping members expand radially and outwardly to snap in the grooves of the bolts, thereby pre-assembling the bolts to the thermal module.

However, during the pre-assembling process, there is no mechanism formed in the bolts which can reliably ensure the snapping of the clipping members into the grooves of the bolts; the clipping members may be mounted to screwed end portions of the bolts if the clipping members are not aligned with the grooves. When this happens, the clipping members could drop from the bolts during transportation of the pre-assembled thermal module. In addition, after the thermal module is assembled to the electronic component, the clipping members are no longer needed. As the clipping members are made of metal with good resiliency, a cost of the thermal module is increased by using the clipping members.

For the foregoing reasons, therefore, there is a need in the art for a securing structure of the heat dissipation device which overcomes the above-mentioned problems.

SUMMARY

According to an exemplary embodiment of the disclosure, a securing structure for assembling a heat dissipation device to a printed circuit board includes a securing member defining a securing hole therein, and a fastener extending vertically through the securing hole. The fastener includes a bolt and a spring surrounding the bolt. The bolt includes a main portion, a bottom fixing portion, and a top head portion. The securing hole includes an inner portion and an outer portion extending horizontally from the inner portion to an outside of the securing member. A width of the outer portion of the securing hole is smaller than the diameter of the fixing portion and larger than the diameter of the main portion. The main portion enters into the inner portion horizontally through the outer portion. The fixing portion of the bolt abuts against a bottom of the securing member. The spring is resiliently compressed between a top of the securing member and the head portion of the bolt. A concave is depressed from the securing member and surrounds the inner portion of the securing hole. A lower portion of the spring is received in the concave. The lower portion of the spring engages a wall of the securing member defining the concave when the fastener is moved horizontally along the securing hole to prevent the bolt from moving horizontally and outwardly to escape from the securing member to the outside.

Other advantages and novel features of the disclosure will be drawn from the following detailed description of the exemplary embodiments of the disclosure with attached drawings.

DETAILED DESCRIPTION OF THE EMBODIMENTS

Figure 1:
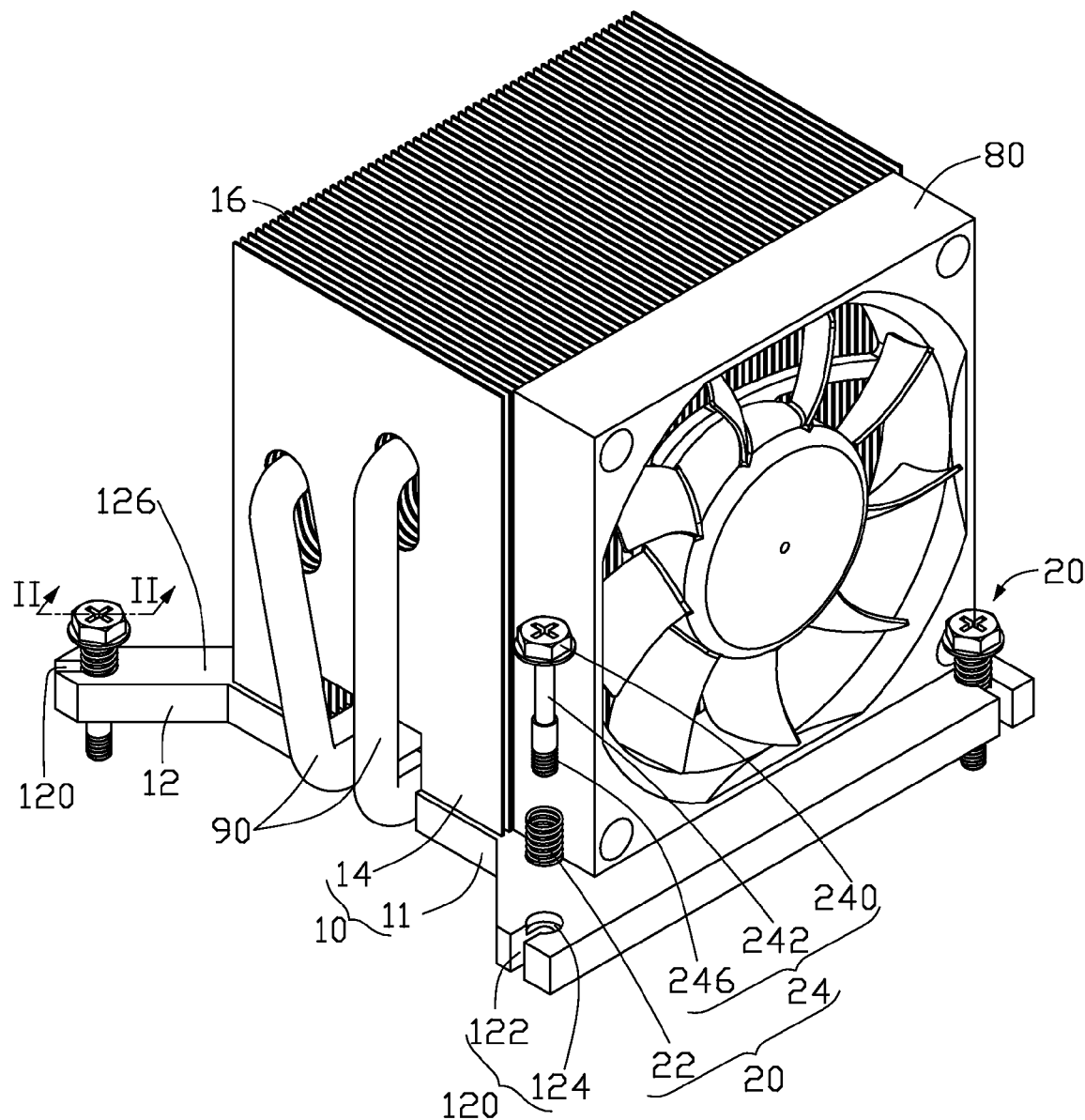
FIG. 1 is an isometric, assembled view of a heat dissipation device according to an exemplary embodiment.
Figure 2:
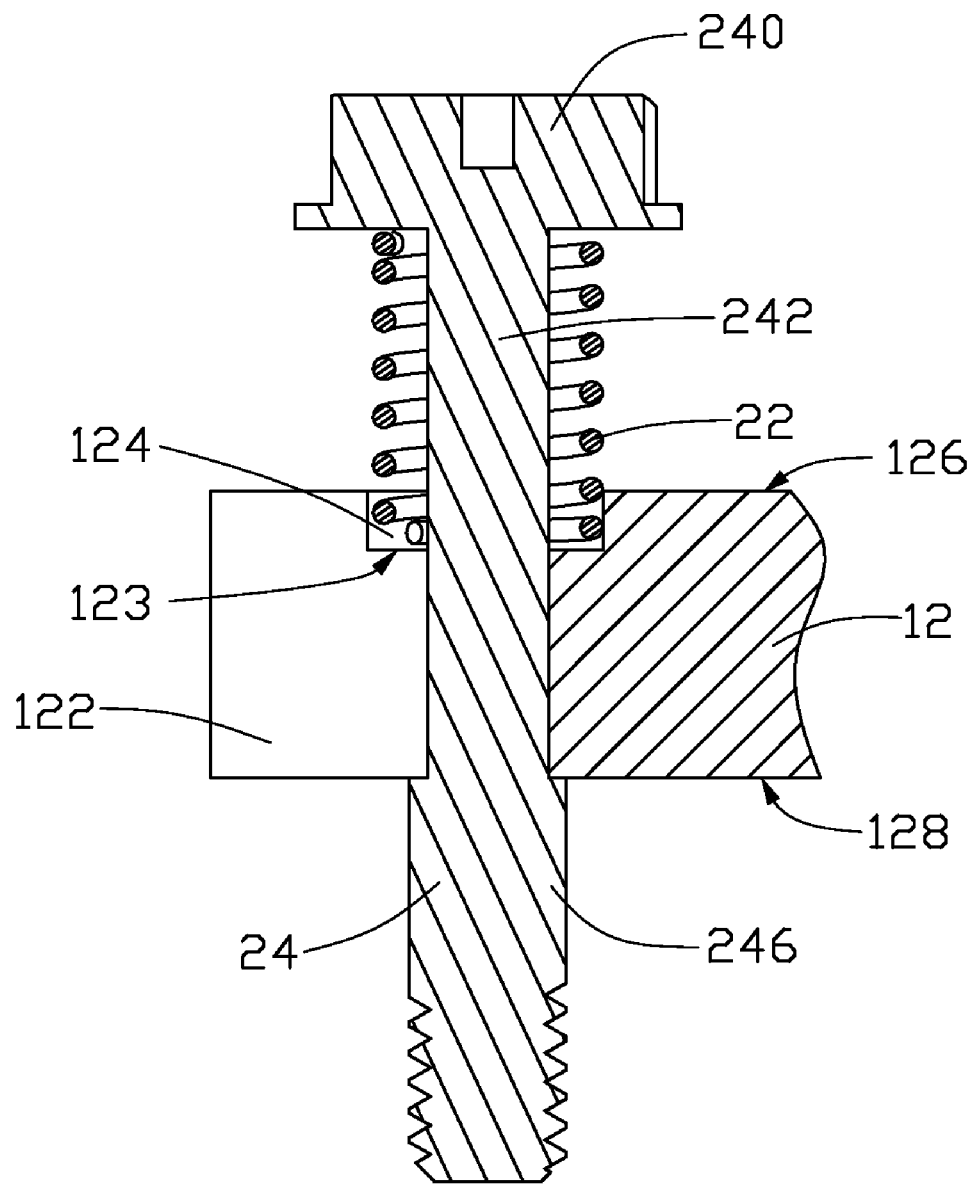
FIG. 2 is an assembled, cross sectional view of a securing structure of the heat dissipation device taken along line II-II of FIG. 1.

Referring to FIGS. 1 and 2, a heat dissipation device according to an exemplary embodiment includes a heat sink 10, a number of fasteners 20, a cooling fan 80, and two heat pipes 90.

The heat sink 10 includes a base 11 and a plurality of parallel fins 14 extending upwardly from the base 11. The base 11 is square-shaped, and is configured for thermally attaching to an electronic component (not shown) which is electronically connected to a circuit board (not shown) to absorb heat of the electronic component. The fins 14 are parallel to each other, and a flow channel 16 is defined between two neighboring fins 14. Each of the heat pipes 90 has an evaporating section embedded into the base 11 and a condensing section extending through the fins 14. The fan 80 is arranged at a lateral side of the heat sink 10 for generating forced airflow. During operation, heat of the electronic component can be timely transferred from the base 11 to the fins 14 by the heat pipes 90. The forced airflow of the fan 80 flows through the flow channels 16 of the fins 14 to take the heat away therefrom. Thus the heat of the electronic component can be dissipated timely, and a relatively lower work temperature of the electronic component can be maintained.

A securing arm 12 extends outwardly and horizontally from each corner of the base 11 of the heat sink 10. The securing arm 12 and the fastener 20 cooperatively construct a securing structure for assembling the heat dissipation device to the printed circuit board, wherein the fasteners 20 are pre-assembled to the securing arms 12 before the heat dissipation device is secured to the printed circuit board. A securing hole 120 is defined vertically through a free end of each securing arm 12. Each of the fasteners 20 extends through one corresponding securing hole 120 for assembling the heat dissipation device to the electronic component on the circuit board.

Each fastener 20 includes a bolt 24 and a spring 22 mounted around the bolt 24. The bolt 24 has a glazed column-shaped main portion 242, a head portion 240 positioned at a top end of the main portion 242, and a fixing portion 246 formed at a bottom end of the main portion 242. The fixing portion 246 has a threaded bottom end. A length of the main portion 242 is greater than a thickness of the securing arm 12. The main portion 242 has a diameter smaller than that of the fixing portion 246. The diameter of the fixing portion 246 is smaller than that of the spring 22. The diameter of the spring 22 is smaller than that of the head portion 240.

Figure 3:
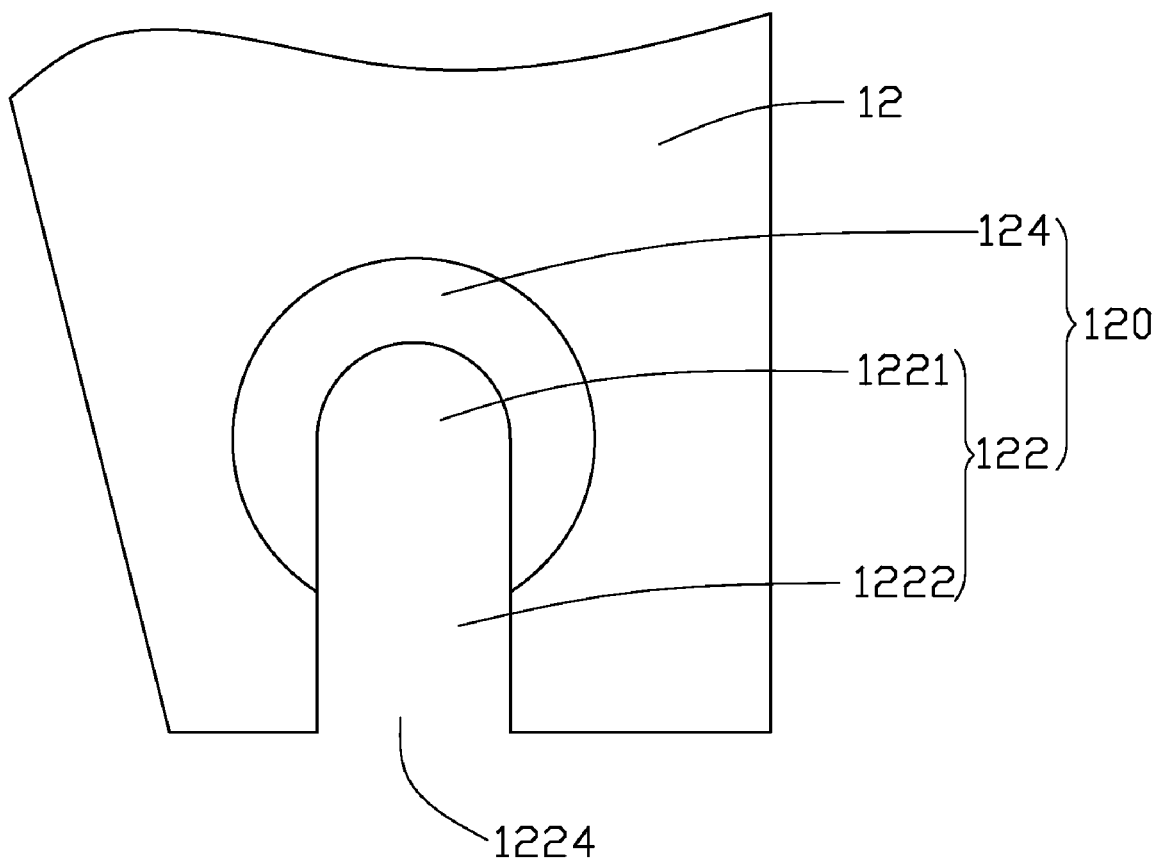
FIG. 3 is an enlarged top view of a free end portion of a securing arm of the securing structure of FIG. 2.

Referring to FIG. 3, each securing hole 120 includes a groove 122 and a concave 124. The groove 122 is U-shaped in a top view as shown in FIG. 3, and includes an arc-shaped inner portion 1221 and an elongated rectangular outer portion 1222. The inner portion 1221 of the groove 122 is substantially semi-circular, with a diameter substantially the same as the main portion 242 of the bolt 24. The outer portion 1222 of the groove 122 extends horizontally from an outer side of the inner portion 1221 through the securing arm 12 to communicate with an outside of the securing arm 12. The outer portion 1222 has a width equal to the diameter of the inner portion 1221. In other words, the groove 122 of the securing hole 120 has a width substantially the same as the diameter of the main portion 242 of the bolt 24. An opening 1224 is formed at a free edge of the securing arm 12 for entrance of the main portion 242 of the bolt 24 into the groove 122. Alternatively, the width of the groove 122 can be a little greater than the diameter of the main portion 242, but should be smaller than the diameter of the fixing portion 246 of the bolt 24.

The concave 124 is depressed from a top surface 126 of the securing arm 12 around the inner portion 1221 of the groove 122, and a central axis of the concave 124 is collinear with that of the inner portion 1221. A diameter of the concave 124 is approximately the same as that of the spring 22 of the fastener 20. Alternatively, the diameter of the concave 124 can be larger than the diameter of the spring 22. A depth of the concave 124 is smaller than the thickness of the securing arm 12. A step 123 is thus formed in the securing arm 12 at a bottom of the concave 124.

Referring to FIG. 2 again, in assembly of the heat dissipation device, the spring 22 is mounted to surround the main portion 242 of the bolt 24. The bolt 24 with the spring 22 is placed near the free edge of the securing arm 12 confronting the opening 1224. The spring 22 is resiliently compressed towards the head portion 240 of the bolt 24 to expose a lower part of the main portion 242 of the bolt 24. Thus only the lower part of the main portion 242 without the compressed spring 22 can enter into the groove 122 of the securing arm 12 via the opening 1224 and then move to the inner portion 1221 of the groove 122 of the securing hole 120. The head portion 240 and an upper part of the main portion 242 with the compressed spring 22 are located above the securing arm 12, and the fixing portion 246 of the bolt 24 is located below the securing arm 12. When the bolt 24 reaches the inner portion 1221 of the groove 122, the spring 22 is partly released into the concave 124. In this situation, the spring 22 is resiliently compressed between the step 123 of the securing arm 122 and the head portion 240 of the bolt 24. Under the action of the elastic expansion of the compressed spring 22, the fixing portion 246 of the bolt 24 abuts against a bottom surface 128 of the securing arm 12. Thus, the axial movement of the fasteners 20 is limited.

In addition, as the diameter of the spring 22 is greater than the width of the groove 122 and is substantially the same as that of the concave 124 of the securing hole 120, an outer side of the spring 22 abuts a wall of the securing arm 12 around the concave 124; thus, the spring 22 of the fastener 20 is retained in the concave 124, and the spring 22 and accordingly the bolt 24 are kept from moving horizontally along the groove 122 to escape from the securing arm 12. Thus the fasteners 20 are pre-assembled to the heat dissipation device reliably and will not be easily disassembled from the pre-assembled position even during transportation. Furthermore, even when the diameter of the concave 124 is larger than the spring 22, the wall of the securing arm 12 defining a part of the concave 124 adjacent to the outer portion 1222 of the groove 122 can still engage with the spring 22 to keep the fastener 20 in position corresponding to the concave 124 when the bolt 24 is moved outwardly along the groove 122.

In the embodiment, the clipping members of the conventional art are not necessary. The fasteners 20 can have a simple structure and accordingly a low cost. In addition, since assembly of the clipping members to the bolts 24 is no longer needed, the fasteners 20 can be pre-assembled to the heat sink 10 directly and more quickly. Accordingly, the present securing structure of the heat dissipation device does not have the disadvantage of the conventional art that the clipping members may engage with the fixing portions and drop from the bolts. When assembling the heat dissipation device to the electronic component, the head portion 240 of each bolt 24 is pressed downwardly and continuously rotated to cause the fixing portion 246 to completely threadedly engage with a back plate (not shown) of the printed circuit board. The electronic component is thus sandwiched between the circuit board and the heat dissipation device, and intimately contacts with the base 11 of the heat sink 10 for dissipation of heat.

Figure 4:
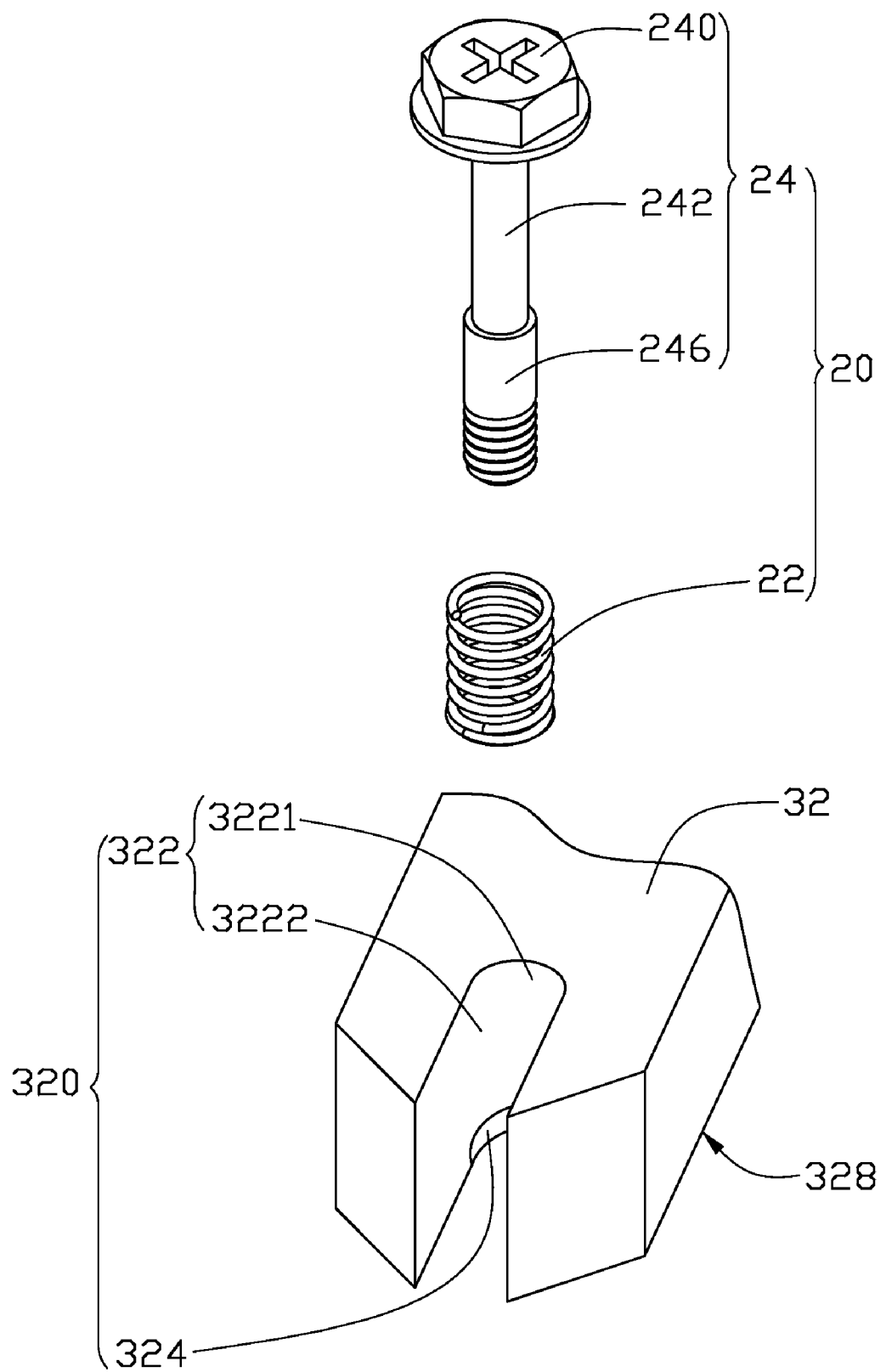
FIG. 4 is an exploded view of an alternative embodiment of the securing structure.
Figure 5:
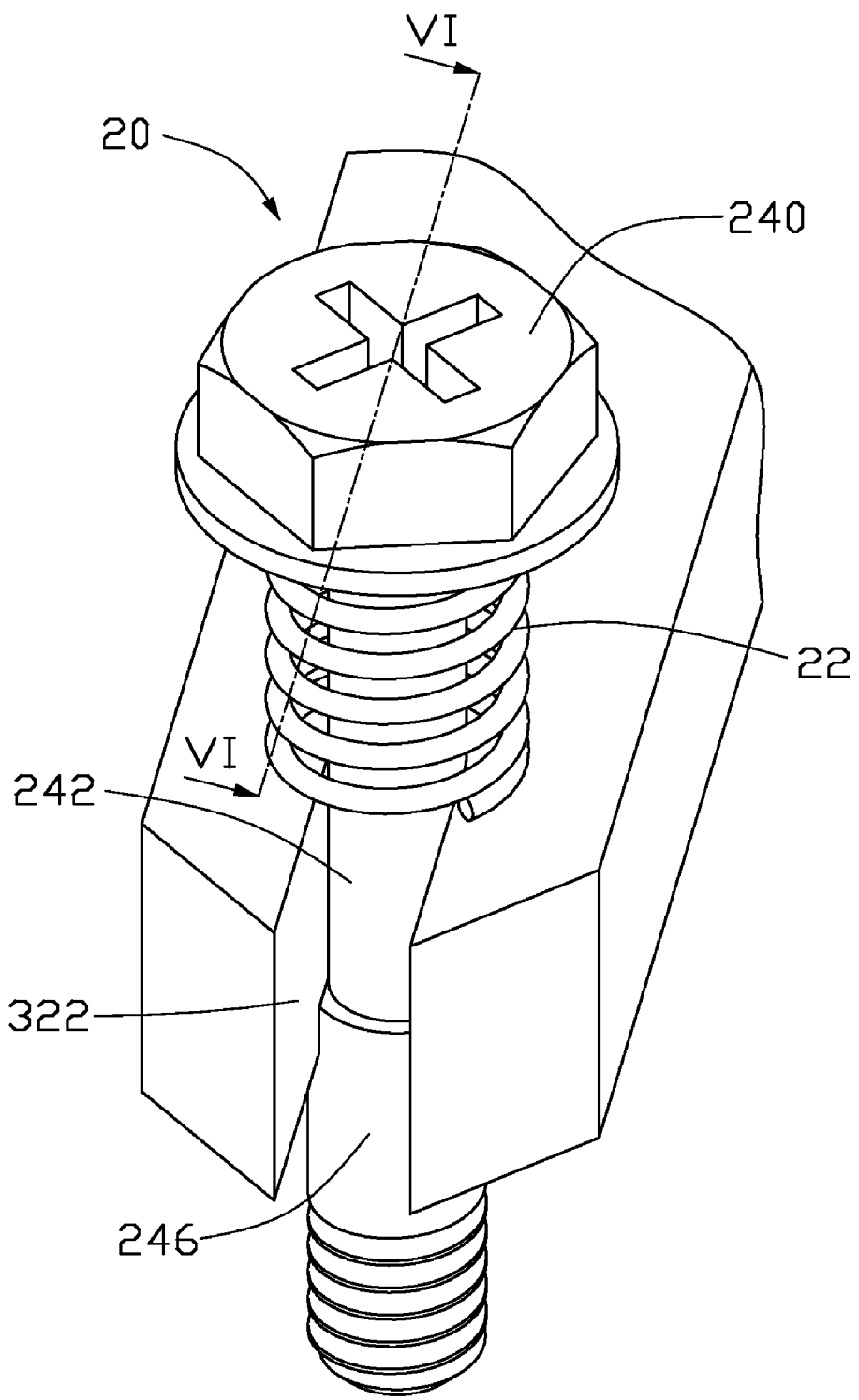
FIG. 5 is an assembled view of the securing structure of FIG. 4.
Figure 6:
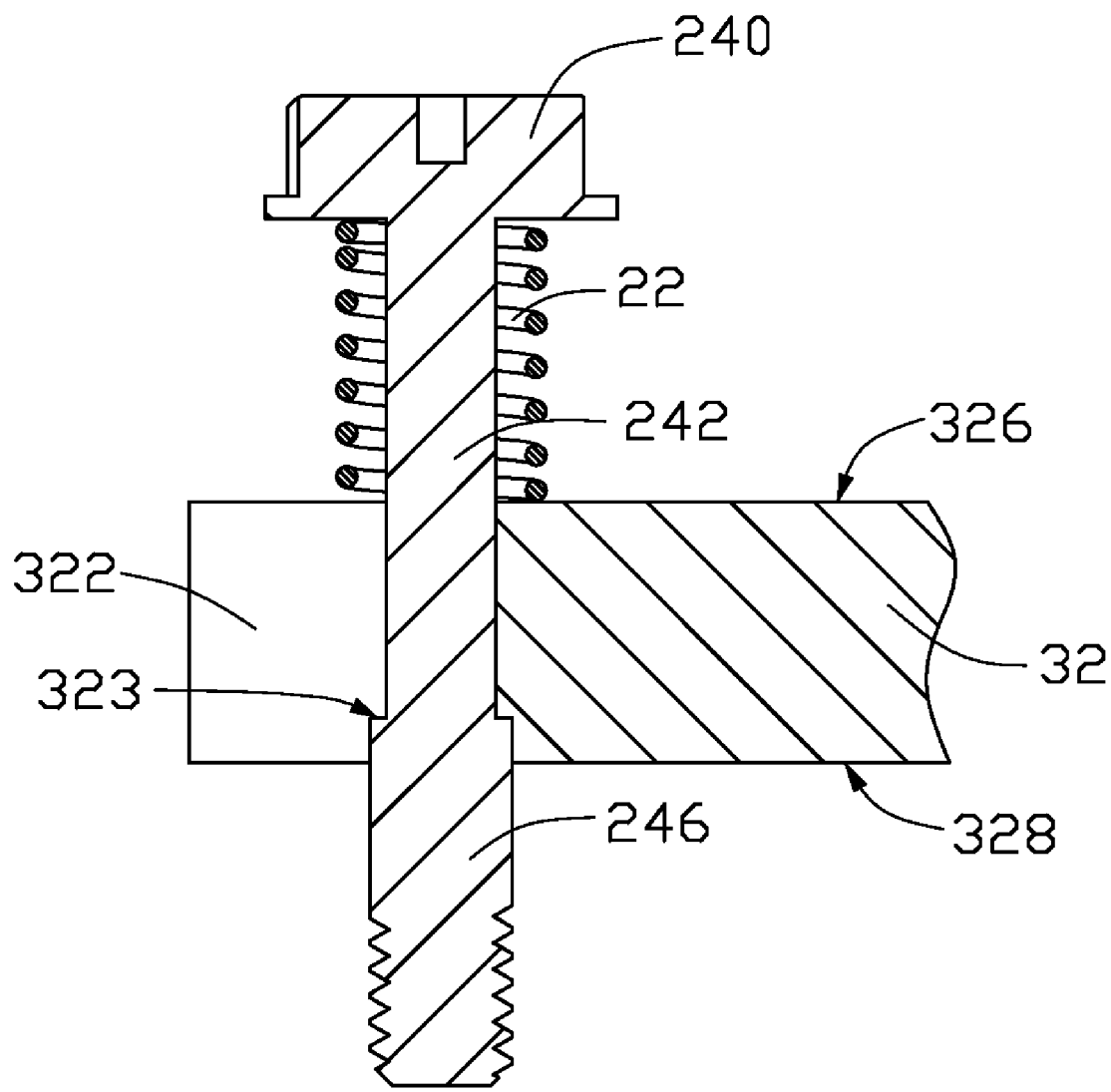
FIG. 6 is a cross sectional view of the securing structure of FIG. 5 taken along line VI-VI.

Referring to FIGS. 4-6, an alternative embodiment of the securing structure is shown. Similarly, the securing structure includes a securing arm 32 defining a securing hole 320 therein and a fastener 20 engaging into the securing hole 320. The securing hole 320 includes a groove 322 and a concave 324. The groove 322 includes an inner portion 3221 and an outer portion 3222. The difference of this embodiment over the previous embodiment is as follows. The concave 324 is depressed upwardly from the bottom surface 328 of the securing arm 32, and surrounds the inner portion 3221 of the groove 322. A step 323 is thus formed at a top of the concave 324. A diameter of the concave 324 is substantially the same as that of the fixing portion 246 of the bolt 24 of the fastener 20. Alternatively, the diameter of the concave 324 can be larger than that of the fixing portion 246.

When assembled, the main portion 242 of the bolt 24 moves into the inner portion 3221 of the groove 322 through the outer portion 3222. The spring 22 of the fastener 20 is resiliently compressed between the top surface 326 of the securing arm 32 and the head portion 240 of the bolt 24. Under the action of the elastic expansion of the compressed spring 22, the fixing portion 246 of the bolt 24 moves upwardly into the concave 324 and abuts tightly against the step 323 of the securing arm 32; thus axial movement of the fasteners 20 is avoided. On the other hand, an outer circumferential surface of the fixing portion 246 abuts a wall of the securing arm 32 around the concave 324 and thus the bolt 24 can not move horizontally along the groove 322 to escape from the securing arm 32. Thus the bolt 24 can not move vertically and horizontally to escape from the securing arm 32.

Figure 7:
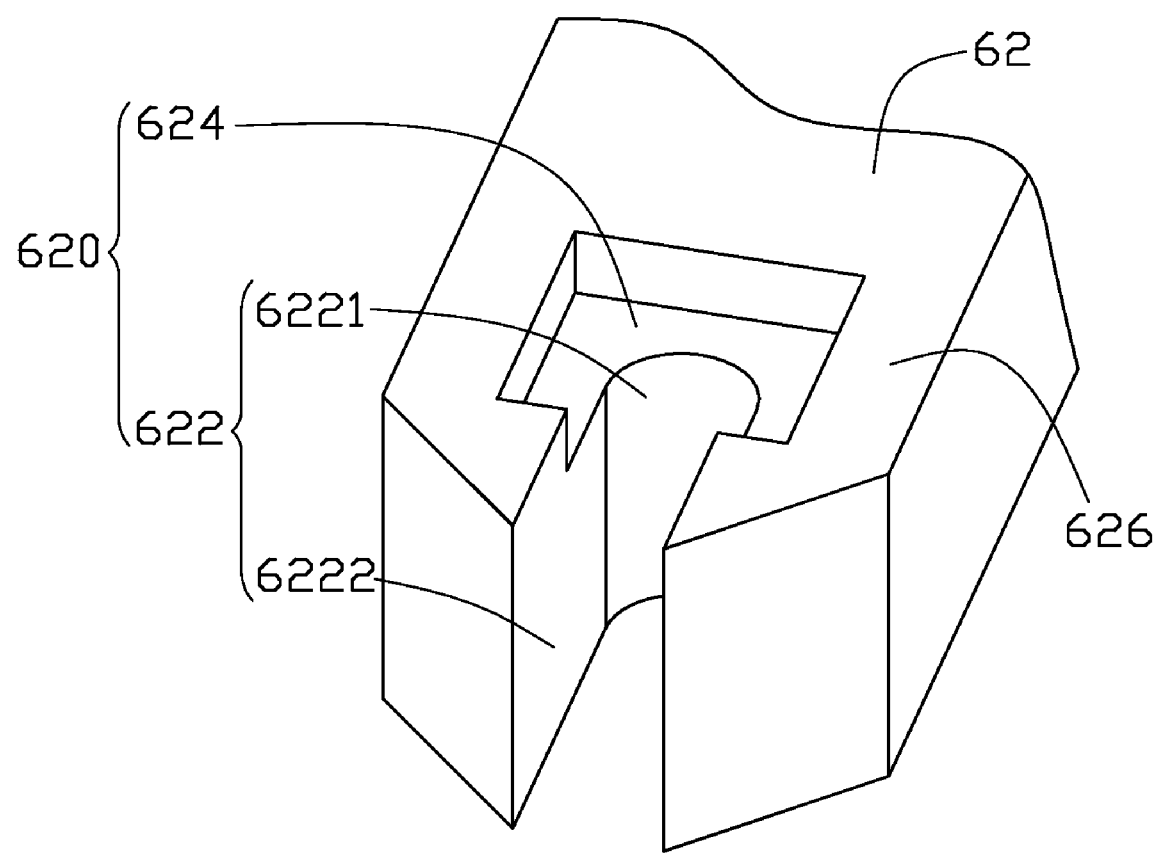
FIG. 7 is an enlarged isometric view of a free end portion of the securing arm of the securing structure according to a third embodiment.

FIG. 7 shows a third embodiment of the securing arm 62. Similar to the first embodiment, the securing arm 62 defines a securing hole 620 having a U-shaped groove 622 and a concave 624 depressed from the top surface 626 of the securing arm 62. The difference between this embodiment and the first embodiment is that the concave 624 is square-shaped. A central axis of the concave 624 is collinear with that of the inner portion 6221 of the groove 622 of the securing hole 620. A width of the concave 624 is substantially the same as the diameter of the spring 22. An outer side of the concave 624 intersects the outer portion 6222 of the groove 622. Thus the spring 22 can be limited in the concave 624 and abuts a wall of the securing arm 62 defining four sides of the concave 624. Therefore, the fasteners 20 can be pre-assembled to the securing arm 62 of the heat dissipation device reliably.

Figure 8:
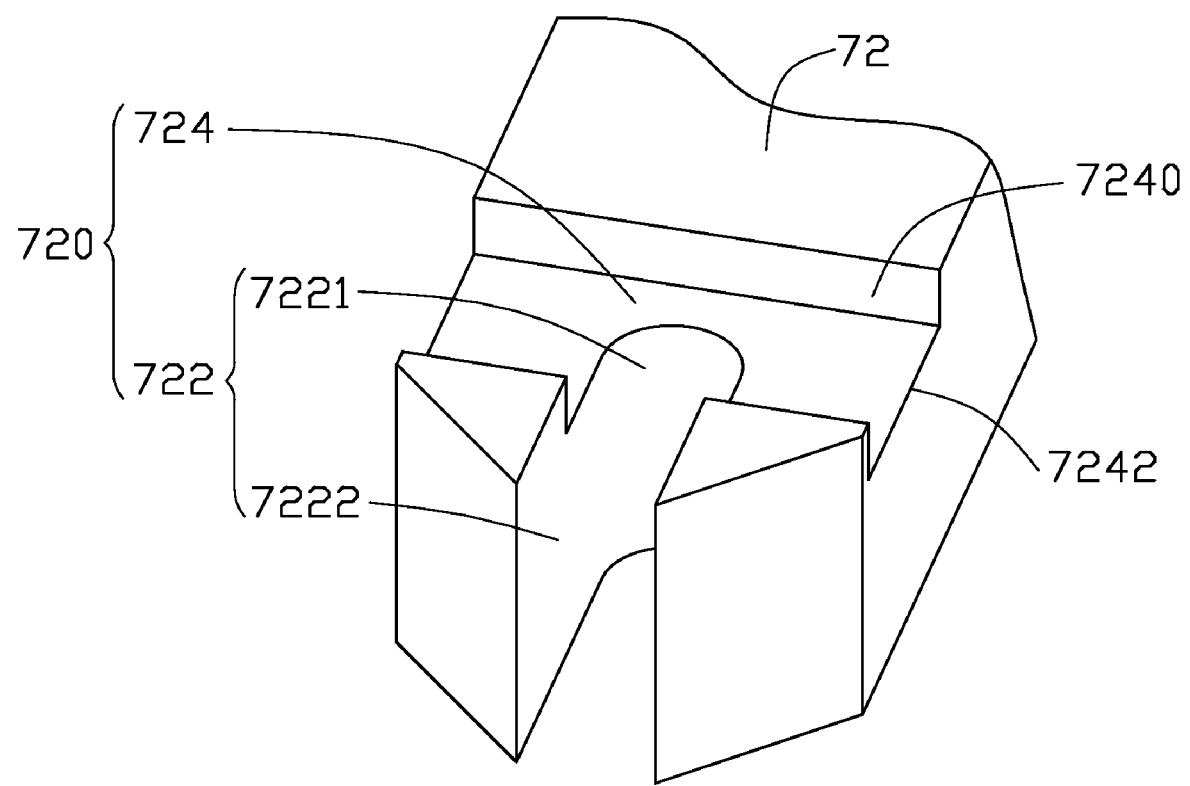
FIG. 8 is a view similar to FIG. 7, but shows a fourth embodiment of the securing arm.

FIG. 8 shows a fourth embodiment of the securing arm 72 having a securing hole 720. The securing hole 720 has an elongate, linear concave 724 over an inner portion 7221 of the groove 722. The concave 724 includes two opposite longer sides 7240 and two opposite shorter sides 7242. The shorter sides 7242 are parallel to the groove 722. The longer sides 7240 are perpendicular to the groove 722, and extend transversely through the securing arm 72. A width of each of the short sides 7242, i.e., a distance between the longer sides 7240, is substantially the same as that of the spring 22. The spring 22 abuts the securing arm 72 at the two opposite longer sides 7240 of the concave 724. Thus the spring can be limited in the concave 724 and is prevented from escaping from the securing arm 72. Accordingly the bolt can be reliably positioned in the inner portion 7221 of the groove 722 and is prevented from moving horizontally along the groove 722 to an outside of the securing arm 72 via the outer portion 7222.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device, comprising:
a number of fasteners each comprising a bolt and a spring, the bolt comprising a main portion, a fixing portion formed at a bottom end of the main portion with a diameter greater than that of the main portion, and a head portion formed at a top end of the main portion with a diameter greater than that of the main portion, the spring being mounted around the main portion with a diameter smaller than that of the head portion;
a base forming a number of securing arms, each securing arm defining a securing hole therein for extension of a corresponding fastener therethrough, the securing hole comprising an inner portion and an outer portion extending horizontally from the inner portion to an outside of the each securing arm, a width of the outer portion of the securing hole being smaller than the diameter of the fixing portion and being larger than the diameter of the main portion, the main portion horizontally entering into the inner portion of the securing hole through the outer portion, the fixing portion abutting against a bottom of the each securing arm, the spring resiliently compressed between a top of the each securing arm and the head portion of the bolt, a concave depressed from the each securing arm and in communication with the inner portion of the securing hole, the concave receiving a portion of the corresponding fastener therein, when the corresponding fastener is moved outwardly and horizontally along the securing hole, a wall of the each securing arm defining the concave engaging with the portion the corresponding fastener to block the corresponding fastener from moving horizontally and outwardly to the outside; and
a number of fins extending upwardly from the base.

2. The heat dissipation device of claim 1, wherein the securing hole is U-shaped, the inner portion is substantially semi-circular, and the outer portion is elongated, a central axis of the concave being collinear with that of the inner portion of the securing hole.

3. The heat dissipation device of claim 2, wherein the concave is depressed from the top of the each securing arm, the spring extending into the concave, a bottom of the spring abutting against the top of the each securing arm at a bottom of the concave, the wall of the each securing arm defining the concave engaging with the spring to block the outward movement of the corresponding fastener.

4. The heat dissipation device of claim 3, wherein the concave is square, and has a width not smaller than the diameter of the spring.

5. The heat dissipation device of claim 3, wherein the concave has an elongate, linear configuration, and comprises two opposite longer sides and two opposite shorter sides, the corresponding fastener engaging with the longer side, a distance between the longer side being not smaller than the diameter of the spring.

6. The heat dissipation device of claim 5, wherein the longer sides of the concave extend through the each securing arm.

7. The heat dissipation device of claim 3, wherein the concave is circular, and has a diameter not smaller than that of the spring.

8. The heat dissipation device of claim 2, wherein the concave is depressed upwardly from the bottom of the each securing arm, the fixing portion extending into the concave and abutting against the each securing arm at a top of the concave, the wall of the each securing defining the concave engaging with the fixing portion to block the outward movement of the corresponding fastener.

9. The heat dissipation device of claim 8, wherein the concave has one of the following shapes: square, circular and rectangular.

10. The heat dissipation device of claim 1, further comprising at least one heat pipe having an evaporating section embedded in the base and a condensing section extending through the fins for transferring heat from the base to the fins.

11. The heat dissipation device of claim 1, further comprising a fan for generating forced airflow, the fan being arranged on a lateral side of the fins, a number of channels defined between the fins for flowing of the forced airflow therethrough.

12. A heat dissipation device, comprising:
a fastener comprising a bolt and a spring, the bolt comprising a main portion, a fixing portion formed at a bottom end of the main portion with a diameter greater than that of the main portion, and a head portion formed at a top end of the main portion with a diameter greater than that of the main portion, the spring being mounted around the main portion with a diameter smaller than that of the head portion; and
a heat sink comprising a base defining a securing hole therein, the securing hole comprising an inner portion and an outer portion extending horizontally from the inner portion to an outside of the base, a width of the outer portion of the securing hole being smaller than the diameter of the fixing portion and being larger than the diameter of the main portion, the main portion horizontally entering into the inner portion of the securing hole through the outer portion, the fixing portion abutting against a bottom of the base, the spring resiliently compressed between the base and the head portion of the bolt, a concave depressed from the base and communicating with the inner portion, the concave receiving a portion of the fastener therein, a wall of the base defining the concave engaging with the portion of the fastener to block the fastener from moving horizontally and outwardly to the outside.

13. The heat dissipation device of claim 12, wherein the securing hole is U-shaped, the inner portion is substantially semi-circular, and the outer portion is elongated, a central axis of the concave being collinear with that of the inner portion of the securing hole.

14. The heat dissipation device of claim 13, wherein the concave is depressed from the top of the base, the spring extending into the concave, a bottom of the spring abutting the top of the base at a bottom of the concave, the wall of the base defining the concave engaging with the spring to block the outward movement of the fastener.

15. The heat dissipation device of claim 14, wherein the concave is circular, and has a diameter substantially equal to that of the spring.

16. The heat dissipation device of claim 14, wherein the concave is square, and has a width substantially equal to the diameter of the spring.

17. The heat dissipation device of claim 14, wherein the concave has an elongate, linear configuration, and comprises two opposite longer sides and two opposite shorter sides, the fastener engaging with one of the longer sides, a distance between the longer sides being substantially equal to the diameter of the spring, and the longer sides of the concave extending through the base.

18. The heat dissipation device of claim 13, wherein the concave is depressed upwardly from the bottom of the base, the fixing portion extending into the concave and abutting against the base at a top of the concave, the wall of the base defining the concave engaging with an outer circumferential surface of the fixing portion to block the outward movement of the bolt.

* * * * *